United States Patent [19]
McDowell et al.

[11] Patent Number: 6,124,701
[45] Date of Patent: Sep. 26, 2000

[54] SYSTEM AND METHOD FOR DETERMINING BATTERY CONDITION AND TELECOMMUNICATIONS EQUIPMENT INCORPORATING THE SAME

[75] Inventors: Richard L. McDowell, Chalfont; Philip D. Mooney, North Wales; James C. Popa, Allentown, all of Pa.

[73] Assignee: Lucent Technologies, Inc., Murray Hill, N.J.

[21] Appl. No.: 09/338,144

[22] Filed: Jun. 22, 1999

[51] Int. Cl.[7] .......................... H01M 10/44; H01M 10/46
[52] U.S. Cl. .............................................................. 320/132
[58] Field of Search ................................... 320/106, 110, 320/132, 133, 148, 151, 155, 156, 161, DIG. 21

[56] References Cited

U.S. PATENT DOCUMENTS

| | | | |
|---|---|---|---|
| 4,024,523 | 5/1977 | Arnold et al. ........................ | 320/161 X |
| 4,433,294 | 2/1984 | Windebank .......................... | 320/162 X |
| 4,746,852 | 5/1988 | Martin ...................................... | 320/106 |
| 5,469,043 | 11/1995 | Cherng et al. ........................... | 320/161 |
| 5,773,961 | 6/1998 | Cameron et al. ....................... | 320/132 |
| 5,780,994 | 7/1998 | Sisemore ................................. | 320/156 |
| 6,016,047 | 1/2000 | Notten et al. ........................... | 320/137 |

*Primary Examiner*—Edward H. Tso

[57] ABSTRACT

A system for, and method of, determining a condition of a battery and telecommunications equipment incorporating the system or the method. In one embodiment, the system includes: (1) a load controller, having a memory, that couples a load of a known magnitude to the battery and (2) a voltage monitor, coupled to the load controller, that measures voltages of the battery at first and second times and provides the voltages to the load controller, the load controller comparing a slope defined by the voltages to a model stored in the memory and regarding the battery to determine a condition thereof.

18 Claims, 2 Drawing Sheets

SYSTEM AND METHOD FOR DETERMINING BATTERY CONDITION AND TELECOMMUNICATIONS EQUIPMENT INCORPORATING THE SAME

TECHNICAL FIELD OF THE INVENTION

The present invention is directed, in general, to telecommunications equipment and, more specifically, to a system and method of determining a condition of a battery.

BACKGROUND OF THE INVENTION

In many battery-powered applications, including portable computer systems and telecommunications equipment, the battery of choice has been the Nickel metal hydride ("NiMH") variety. NiMH batteries produce relatively large amounts of constant voltage and constant current power per pound and are able to endure thousands of charge/discharge cycles during their lifetime. They are also portable and safe to use.

These and other rechargeable batteries do, however, have operating peculiarities. First, the performance of such batteries usually degrades over time. This degradation manifests itself more in the total amount of power the battery can deliver per charge cycle, rather than in a drop in voltage or current of the power. Second, many types of rechargeable batteries have a memory effect, whereby if the battery is used only partially and then recharged, the battery will, in effect, "remember" that it was only partially used. If this half-use/recharge cycle is repeated often enough (typically more than 20 times in a row), the battery will lose its ability to take a complete charge. To prevent this loss of capacity, the battery must undergo an occasional complete discharge/charge cycle (a so-called "reconditioning" or "deep discharge"). Third, the efficiency with which some of these batteries (e.g., a NiMH battery) recharge is a function of both the extent to which it has degraded over time and its memory.

In an effort to keep track of the amount of charge stored in a rechargeable battery, many battery-powered appliances are provided with battery charge level monitors and low power indicators that inform the user when the voltage level of the battery falls below a predetermined value. More elaborate charge level monitors track and indicate the charge level of the battery over a broad range of anticipated values. These features usually increase the overall cost of the appliance, sometimes significantly.

Such battery charge level monitors have been embodied in a programmable microcontroller associated with the battery. The programmable microcontroller has associated memory, often in the form of a register, employed to store charge data representing an estimated quantity of charge remaining in the battery. The microcontroller may derive the estimate from a preprogrammed static self-discharge table or algorithm. Such a microcontroller-battery combination is defined as a "smart battery." Portable computer systems commonly employ these smart batteries.

Another method for monitoring battery discharge within a portable computer system involves programming the microcontroller to act as a simple timer that is set immediately after the battery is charged. The value of the timer initially represents an estimate of the overall time the battery can power the system without recharging. As the computer system operates, the timer decrements at a given rate such that the user can determine how long the system can continue to operate.

Unfortunately, this method has many drawbacks. For instance, failure to set the timer or improper setting of the timer results in inaccurate predictions of the time of power loss. Similarly, if the battery has been only partially recharged, there is no reference point from which to estimate the time of power loss. Furthermore, this method does not take into account that some operations may consume more power than other operations.

More accurate methods have therefore been proposed in which the microcontroller varies a charge value to account for the amount of charge replenished by a battery recharger and the amount of charge consumed by specific operations. Although battery charge level monitors employing such methods have been quite successful in accurately estimating the power loss that results from the active operations of the computer system, such monitors do not track the amount of self-discharge that occurs within the battery when the system is turned off. In some situations and particularly when the computer system remains off for extended periods, self-discharge can account for a significant percentage of the overall charge depletion of the battery.

Unfortunately, these battery charge-level monitors do not take into account degradation of the rechargeable battery over time, as noted above. These monitors furthermore do not take an active role in reducing or eliminating any memory effects in rechargeable batteries, leaving the job of battery management, including reconditioning, to the user. Therefore, existing battery monitors and management apparatus do not provided users with overall, user independent battery state and condition information in an appropriately integrated fashion.

Accordingly, what is needed in the art is a way to accurately determine, in a cost-effective, integrated fashion, the condition of an in situ battery.

SUMMARY OF THE INVENTION

To address the above-discussed deficiencies of the prior art, the present invention provides a system for, and method of, determining a condition of a battery and telecommunications equipment incorporating the system or the method. In one embodiment, the system includes: (1) a load controller, having a memory, that couples a load of a known magnitude to the battery and (2) a voltage monitor, coupled to the load controller, that measures voltages of the battery at first and second times and provides the voltages to the load controller, the load controller comparing a slope defined by the voltages to a model stored in the memory and regarding the battery to determine a condition thereof.

The present invention therefore introduces the broad concept of monitoring the voltage level of a battery as a load is applied. The slope of the voltage level over time is advantageously employed to determine the condition of the battery. For purposes of the present invention, "condition" is the charge-state of the battery. A battery can have three charge-states: (1) "charged," (2) "discharged" and (3) "damaged." "Discharged" means that the battery is not suitable for providing power to a useful load (such as telecommunications circuitry). "Charged" means that the battery is suitable for providing power to a useful load, but does not necessarily mean fully charged. "Damaged" means not only that the battery is not suitable for providing power to a useful load, but furthermore that no amount of charging will render it suitable for providing power to a useful load. Undamaged batteries therefore are either charged or discharged; damaged batteries are neither charged nor discharged.

The term "load" is broadly defined for purposes of the present invention as including not only positive loads (those that are a net current sink and therefore act to drain the battery), but also negative loads (those that are a net current source and therefore act to charge the battery). Various embodiments that are hereinafter illustrated and described employ a positive load; therefore, as the load is applied, the voltage of the battery at the first time is expected to exceed the voltage of the battery at the second time. Alternatively, if a negative load were to be applied in lieu of the positive load, the voltage of the battery at the second time is expected to exceed the voltage of the battery at the first time. The principle of the present invention extends to cover both positive and negative loads.

In one embodiment of the present invention, a fixed period of time separates the first and second times. Alternatively, a variable period of time may separate the first and second times. Further, voltages may be measured at third, fourth or other times, as may be suitable for a given application.

In one embodiment of the present invention, the model contains voltage curves for the battery. In an embodiment to be illustrated and described, the model contains three curves, one each for "charged," "discharged" and "damaged" charge-states.

In one embodiment of the present invention, the first and second voltages define a line having a given negative slope. In an embodiment to be illustrated and described, the load controller can employ the slope to determine the condition of the battery.

In one embodiment of the present invention, the load controller comprises model adaptation circuitry that adapts the model by monitoring the battery over time. Alternatively, the model may be fixed for a given type or brand of battery.

In one embodiment of the present invention, the load controller compares both absolute and relative values of the voltages to the model to determine the condition of the battery. In an embodiment to be illustrated and described, the absolute value of either the first or second voltage and the slope of the line defined by the first and second voltage together indicate the condition of the battery.

In one embodiment of the present invention, the load is a test load (such as a resistive load internal to the load controller). Alternatively, the load is a useful load, such as telecommunications circuitry.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

As stated above, the various embodiments hereinafter illustrated and described employ a positive load. As the load is applied, the voltage of the battery at the first time is expected to exceed the voltage of the battery at the second time. The principles of the present invention apply as well to negative loads, as defined above.

Figure 1:
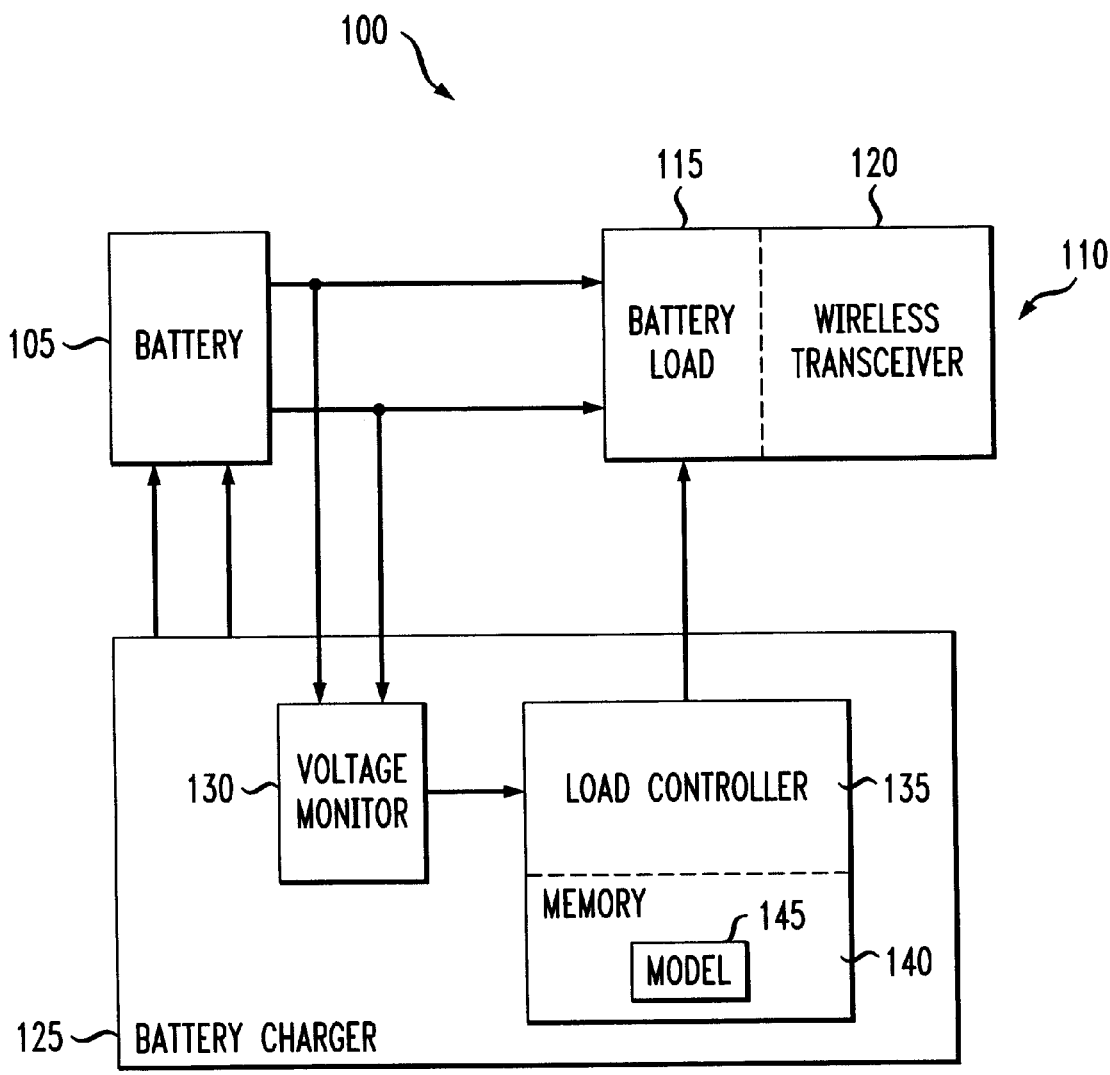
FIG. 1 illustrates a diagram of a system used to determine the condition of a battery according to the principles of the present invention.

Referring initially to FIG. 1, illustrated is a diagram of a system 100 used to determine the condition of a battery according to the principles of the present invention. The system 100 includes a battery 105, telecommunications equipment 110 having a battery load 115 and a wireless transceiver 120, and a battery charger 125 having a load controller 135 containing a memory 140 with a model 145 and a voltage monitor 130. The current embodiment of the present invention provides a system that incorporates a method of determining a condition of the battery 105.

As shown in FIG. 1, the battery 105 is coupled to the battery load 115 and the wireless transceiver 120. The battery charger 125, which is also coupled to the battery 105, uses the load controller 135 and the voltage monitor 130 for determining a condition of the battery 105. The load controller 135 couples a load of a known magnitude to the battery 105 and then compares specific voltage measurements received from the voltage monitor 130 to the model 145 stored in the memory 140. The battery load 115 applied to the battery 105 may be the telecommunications circuitry 110, shown in FIG. 1. Alternatively, the battery load 115 may be a test load, such as a resistive load that is internal to the load controller 135. In this embodiment, the voltage monitor 130 at least measures these voltages of the battery 105 at first and second times. Of course, voltage measurements may be taken at more than first and second times.

The present invention introduces the broad concept of monitoring the voltage level of the battery 105 as a load is applied to determine the condition of the battery 105. Recall that "condition" is the charge-state of the battery 105, which may have the two general states of undamaged and damaged; an undamaged state may be either charged or discharged. These thereby yield the three possible charge-state conditions of charged, discharged or damaged. Only the state of being charged means that the battery 105 is suitable for providing power to a useful load, but does not necessarily mean that the battery 105 is fully charged.

As will be shown in FIG. 2, a fixed period of time may separate the first and second times. Alternatively, a variable period of time may separate the first and second times. Further, voltages may be measured at third, fourth or other times, as may be suitable for a given application. The model 145 contains voltage curve information for the battery 105. Therefore, the model 145 typically contains information regarding three curves relating to each of the possible three charge-states of the battery 105. A minimum of two curves is required to identify the three possible states.

In this embodiment, the first and second voltages define a line having a given negative slope. The load controller 135 can employ the slope to determine the condition of the battery. Additionally, the load controller 135 may comprise model adaptation circuitry that adapts the model 145 by monitoring the battery over time. Alternatively, the model 145 may be fixed for a given type or brand of battery. The load controller 135 may also compare absolute, relative or a combination of these values of the voltages measured to the model 145 to determine the condition of the battery 105. Alternately, the absolute value of either the first or second voltage and the slope of the line defined by the first and second voltage together may be used to indicate the condition of the battery 105.

Figure 2C:
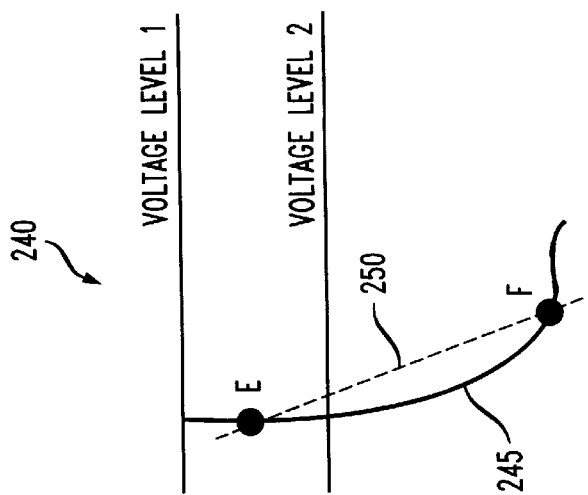
FIG. 2C illustrates a typical load response waveform showing the battery of FIG. 1 having a charge-state of damaged.
Figure 2B:
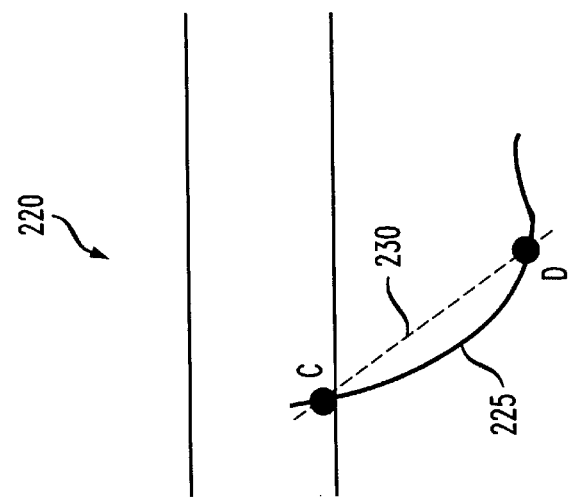
FIG. 2B illustrates a typical load response waveform showing the battery of FIG. 1 having a charge-state of discharged.
Figure 2A:
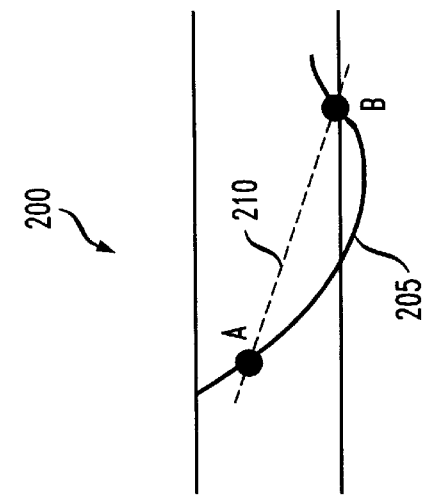
FIG. 2A illustrates a typical load response waveform showing the battery of FIG. 1 having a charge-state of charged.

Turning now to FIG. 2A, illustrated is a typical load response waveform 200 showing the battery 105 of FIG. 1 having a charge-state of charged. The load response waveform 200 includes a voltage waveform 205, first and second voltage points A, B and a voltage slope 210 defined by the first and second voltage points A, B. The voltage slope 210 may be used to determine a rate of voltage drop for the voltage waveform 205.

In this embodiment, the voltage slope 210 defines an average rate of voltage drop determined during a fixed period of time between the first and second voltage points A, B. Of course, a variable period of time may be used to define first and second voltage points A, B, and therefore the voltage slope 210. Alternately, the voltage slope 210 may be determined by a maximum instantaneous voltage drop. The voltage slope 210, associated with the voltage waveform 205, may then be compared to parameters stored in the model 145. This comparison of the slope 210 to the model 145 will then contribute to the determination that the battery 105 is charged.

The voltage waveform 205 originates from a voltage level VOLTAGE LEVEL 1, in this embodiment, and is generated when the battery load 115 is applied to the battery 105 by the load controller 135. The voltage level VOLTAGE LEVEL 1 represents a voltage that is greater than a voltage level VOLTAGE LEVEL 2 as shown. The voltage level VOLTAGE LEVEL 2 may represent a minimum acceptable loaded voltage level for a battery that is charged. Therefore, the voltage level VOLTAGE LEVEL 2 may be used for an absolute determination in the model 145 that the battery 105 is charged. Alternately, a voltage drop determined by a difference between voltage levels VOLTAGE LEVEL 1 and VOLTAGE LEVEL 2 may be used for a relative determination in the model 145 that the battery 105 is charged.

Turning now to FIG. 2B, illustrated is a typical load response waveform 220 showing the battery 105 of FIG. 1 having a charge-state of discharged. The load response waveform 220 includes a voltage waveform 225, first and second voltage points C, D and a voltage slope 230 defined by the first and second voltage points C, D. The voltage slope 230 is seen to be steeper (a more negative slope) than the voltage slope 210 indicating a larger voltage drop than shown for the load response waveform 200, which results from application of the battery load 115.

This information, coupled with absolute and relative voltage values that are associated with the voltage waveform 225 allow the model 145 to determine that the battery 105 is discharged. Of course, either the slope information or the voltage values information may be used separately by the model 145, as appropriate, to determine the condition of the battery 105. However, combining the two classes of information enhances the accuracy of battery charge-state determination.

Turning now to FIG. 2C, illustrated is a typical load response waveform 240 showing the battery 105 of FIG. 1 having a charge-state of damaged. The load response waveform 240 includes a voltage waveform 245, first and second voltage points E, F and a voltage slope 250 defined by the first and second voltage points E, F. The voltage slope 250 is seen to be steeper than either the voltage slope 210 or the voltage slope 230 indicating an even larger voltage drop for the battery 105. This is seen to occur even though the voltage waveform 245 originates at the voltage level VOLTAGE LEVEL 1. This information allows the model 145 to determine that the battery 105 is damaged.

Of course, indicators other than those discussed above may also allow the model 145 to determine that the battery 105 is either charged, discharged or damaged, as well. For example, the model 145 may contain a history of responses for the battery 105 that allows an adaptive or learning response to be accommodated. This adaptive or learning response may further apply to an individual battery or to a suite of batteries, allowing the model 145 to become highly accurate or even predictive in nature.

Although the present invention has been described in detail, those skilled in the art should understand that they can make various changes, substitutions and alterations herein without departing from the spirit and scope of the invention in its broadest form.

What is claimed is:

1. A system for determining a condition of a battery, comprising:

a load controller, having a memory and model adaptation circuitry, that couples a load of a known magnitude to said battery, said model adaptation circuitry adapting a model of said battery by monitoring said battery over time; and a voltage monitor, coupled to said load controller, that measures voltages of said battery at first and second times and provides said voltages to said load controller, said load controller comparing a slope defined by said voltages to said model stored in said memory and regarding said battery to determine a condition thereof.

2. The system as recited in claim 1 wherein a fixed period of time separates said first and second times.

3. The system as recited in claim 1 wherein said model contains voltage curves for said battery.

4. The system as recited in claim 1 wherein said first and second voltages define a line having a given negative slope.

5. The system as recited in claim 1 wherein said load controller compares both absolute and relative values of said voltages to said model to determine said condition of said battery.

6. The system as recited in claim 1 wherein said load is a test load.

7. A method of determining a condition of a battery, comprising:

coupling a load of a known magnitude to said battery;

measuring voltages of said battery at first and second times;

comparing a slope defined by said voltages to a model regarding said battery to determine a condition thereof; and adapting said model by monitoring said battery over time.

8. The method as recited in claim 7 wherein a fixed period of time separates said first and second times.

9. The method as recited in claim 7 wherein said model contains voltage curves for said battery.

10. The method as recited in claim 7 wherein said first and second voltages define a line having a given negative slope.

11. The method as recited in claim 7 wherein said load controller compares both absolute and relative values of said voltages to said model to determine said condition of said battery.

12. The method as recited in claim 7 wherein said load is a test load.

13. Telecommunications equipment, comprising:

a wireless transceiver;

a battery, coupled to said transceiver;

a battery charger, couplable to said battery and including a system for determining a condition of said battery, including:

a load controller, having a memory and model adaptation circuitry, that couples a load of a known magnitude to said battery, said model adaptation circuitry adapting a model of said battery by monitoring said battery over time, and a voltage monitor, coupled to said load controller, that measures voltages of said battery at first and second times and provides said voltages to said load controller, said load controller comparing a slope defined by said voltages to said model stored in said memory and regarding said battery to determine a condition thereof.

14. The equipment as recited in claim 13 wherein a fixed period of time separates said first and second times.

15. The equipment as recited in claim 13 wherein said model contains voltage curves for said battery.

16. The equipment as recited in claim 13 wherein said first and second voltage s define a line having a given negative slope.

17. The equipment as recited in claim 13 wherein said load controller compares both absolute and relative values of said voltages to said model to determine said condition of said battery.

18. The equipment as recited in claim 13 wherein said load is a test load.

* * * * *